US007905199B2

(12) United States Patent
Hautala et al.

(10) Patent No.: US 7,905,199 B2
(45) Date of Patent: Mar. 15, 2011

(54) METHOD AND SYSTEM FOR DIRECTIONAL GROWTH USING A GAS CLUSTER ION BEAM

(75) Inventors: John J. Hautala, Beverly, MA (US); Martin D. Tabat, Nashua, NH (US)

(73) Assignee: TEL Epion Inc., Billerica, MA (US)

( * ) Notice: Subject to any disclaimer, the term of this patent is extended or adjusted under 35 U.S.C. 154(b) by 172 days.

(21) Appl. No.: 12/145,156

(22) Filed: Jun. 24, 2008

(65) Prior Publication Data

US 2009/0314954 A1 Dec. 24, 2009

(51) Int. Cl.
*H01J 27/02* (2006.01)
*C23C 14/14* (2006.01)

(52) U.S. Cl. ............ 118/723 CB; 118/723 FI; 250/425; 427/469; 204/192.1; 204/192.15

(58) Field of Classification Search .................. 250/288, 250/423 R, 424, 425; 204/192.1, 192.11, 204/192.15, 192.3, 192.34, 192.32, 298.01, 204/298.04; 427/524, 469, 474, 533, 535, 427/537; 118/723 FI, 723 CB
See application file for complete search history.

(56) References Cited

U.S. PATENT DOCUMENTS 4,361,762 A 11/1982 Douglas
4,886,971 A 12/1989 Matsumura et al.
4,916,311 A 4/1990 Fuzishita et al.
6,218,207 B1 4/2001 Itoh et al.
6,613,240 B2 * 9/2003 Skinner et al. .................. 216/38
6,797,339 B2 9/2004 Akizuki et al.
7,060,989 B2 6/2006 Swenson et al.
7,173,252 B2 2/2007 Mack
7,259,036 B2 * 8/2007 Borland et al. .................. 438/37
7,301,733 B1 * 11/2007 Fukuzawa et al. ......... 360/324.1
7,365,341 B2 * 4/2008 Saito et al. .................... 250/427
7,626,183 B2 * 12/2009 Wagner et al. ........... 250/492.21
7,642,205 B2 * 1/2010 Timans ......................... 438/795
7,794,798 B2 * 9/2010 Hautala .......................... 427/526
2002/0014407 A1 * 2/2002 Allen et al. .............. 204/298.36
2002/0130275 A1 9/2002 Mack et al.
2003/0073314 A1 * 4/2003 Skinner et al. ................ 438/689
2004/0137158 A1 * 7/2004 Kools et al. ................... 427/404
(Continued)

FOREIGN PATENT DOCUMENTS

FR 2850400 A1 7/2004
(Continued)

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

(Continued)

*Primary Examiner* — Bernard E Souw
(74) *Attorney, Agent, or Firm* — Wood, Herron & Evans, LLP

(57) ABSTRACT

A method for growing material on a substrate is described. The method comprises directionally growing a thin film on one or more surfaces of a substrate using a gas cluster ion beam (GCIB) formed from a source of precursor for the thin film, wherein the growth occurs on surfaces oriented substantially perpendicular to the direction of incidence of the GCIB, and growth is substantially avoided on surfaces oriented substantially parallel to the direction of incidence.

19 Claims, 15 Drawing Sheets

U.S. PATENT DOCUMENTS

| | | | | |
|---|---|---|---|---|
| 2006/0043317 | A1 | 3/2006 | Ono et al. | |
| 2006/0124934 | A1 * | 6/2006 | Fukumiya et al. | 257/66 |
| 2006/0278611 | A1 * | 12/2006 | Sato et al. | 216/66 |
| 2007/0077499 | A1 * | 4/2007 | Ikuta et al. | 430/5 |
| 2009/0071818 | A1 * | 3/2009 | Fukumiya et al. | 204/192.11 |
| 2009/0087578 | A1 * | 4/2009 | Hautala | 427/526 |
| 2009/0087579 | A1 * | 4/2009 | Hautala | 427/527 |
| 2009/0152629 | A1 * | 6/2009 | Hu et al. | 257/344 |
| 2009/0314954 | A1 * | 12/2009 | Hautala et al. | 250/424 |
| 2009/0317564 | A1 * | 12/2009 | Hautala et al. | 427/563 |
| 2010/0193898 | A1 * | 8/2010 | Hautala et al. | 257/506 |
| 2010/0200946 | A1 * | 8/2010 | Hautala | 257/506 |
| 2010/0227142 | A1 * | 9/2010 | Hautala et al. | 428/220 |

FOREIGN PATENT DOCUMENTS

| | | |
|---|---|---|
| JP | 62296357 A | 12/1987 |

OTHER PUBLICATIONS

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 233-226, XP001031961, ISSN: 0168-583X.

European Patent Office, International Search Report and Written Opinion issued in related International Application No. PCT/US2009/046417 dated Jan. 13, 2010, 18 pp.

Hautala, J., et al., "Infusion Processing: An Alternative to Plasma Technology for Semiconductor Device Manufacturing", Proceedings of the Electrochemical Society, Symposium on ULSI Process Integration IV (Quebec PR, Canada, May 16-20, 2005), vol. 6, pp. 118-130.

Shao et al., "Nitrogen gas-cluster ion beam—A new nitrogen source for GaN growth", Mat. Res. Soc. Symp. Proc., 2003, vol. 743, pp. 97-102.

Akizuki, M. et al., SiO2 Film Formation at Room Temperature by Gas Cluster Ion Beam Oxidation, Nuclear Instruments and Methods in Physics Research B 112 (1996) 83-85.

European Patent Office, Invitation to Pay Additional Fees in related International Application No. PCT/US2009/046417 dated Sep. 23, 2009, 5 pp.

* cited by examiner

METHOD AND SYSTEM FOR DIRECTIONAL GROWTH USING A GAS CLUSTER ION BEAM

CROSS-REFERENCE TO RELATED APPLICATIONS

This application is related to co-pending U.S. patent application Ser. No. 12/144,968, entitled "METHOD AND SYSTEM FOR GROWING A THIN FILM USING A GAS CLUSTER ION BEAM", filed on even date herewith. The entire content of this application is herein incorporated by reference in its entirety.

BACKGROUND OF THE INVENTION

1. Field of the Invention

The invention relates to a method for growing a thin film using a gas cluster ion beam (GCIB).

2. Description of related Art

Gas-cluster ion beams (GCIB's) are used for etching, cleaning, smoothing, and forming thin films. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electron charge and an integer greater than or equal to one that represents the charge state of the cluster ion.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, and nitrous oxide, and mixtures of these gases.

Several emerging applications for GCIB processing of substrates on an industrial scale are in the semiconductor field. Although GCIB processing of a substrate is performed in a wide variety of processes, many processes fail to provide adequate control of critical properties and/or dimensions of the surface, structure, and/or film subject to GCIB treatment.

SUMMARY OF THE INVENTION

The invention relates to a method for growing a thin film using a gas cluster ion beam (GCIB).

According to one embodiment, a method of forming a thin film on a substrate is described. The substrate has a plurality of surfaces including one or more first surfaces lying substantially parallel to a first plane and one or more second surfaces lying substantially perpendicular to said first plane. The method comprises: directing a gas cluster ion beam (GCIB) formed from a source of precursor for a thin film toward the substrate with a direction of incidence; and orienting the substrate relative to the direction of incidence such that the first plane is substantially perpendicular to the direction of incidence to directionally grow the thin film on the one or more first surfaces oriented substantially perpendicular to the direction of incidence, while substantially avoiding growth of the thin film on the one or more second surfaces oriented substantially parallel to the direction of incidence. The growth of the thin film comprises constituents from the source of precursor and constituents from the substrate.

According to a further embodiment, directing the GCIB further comprises: generating the GCIB in the reduced-pressure environment from a pressurized gas mixture having the source of precursor; selecting a beam acceleration potential; selecting a beam dose; accelerating the GCIB according to the beam acceleration potential; and irradiating the accelerated GCIB onto the substrate according to the beam dose.

DETAILED DESCRIPTION OF SEVERAL EMBODIMENTS

Figure 1:
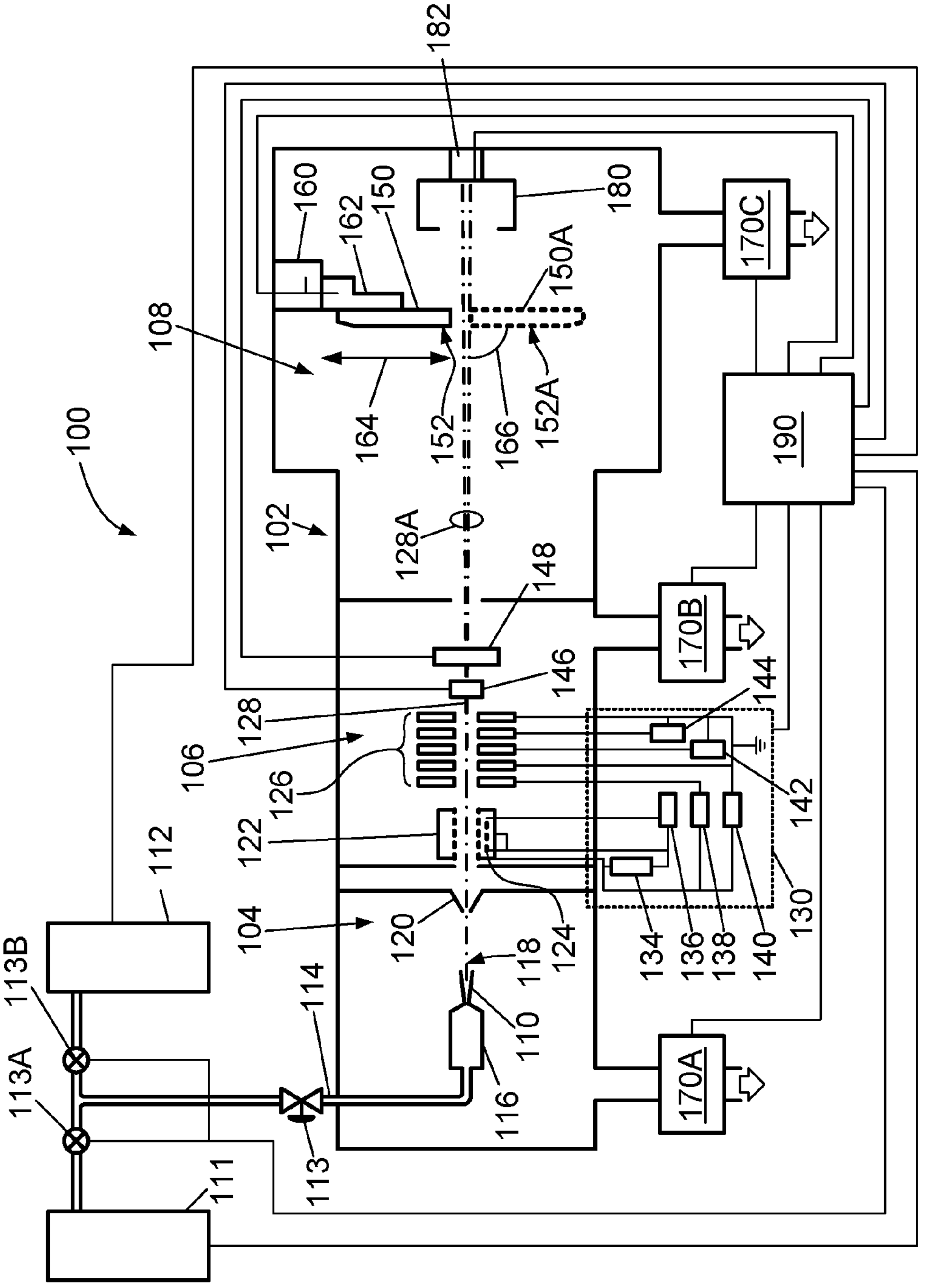
FIG. 1 is an illustration of a GCIB processing system.

A method and system for forming a thin film on a substrate using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

As described above, there is a general need for forming thin films of material on a surface of a substrate using a GCIB. In particular, there is a need to grow thin films on a substrate, while providing adequate control of critical properties and/or dimensions of the surface, structure, and/or film subject to GCIB treatment.

Furthermore, as described above, there is a need for selectively growing material on only chosen surfaces of a substrate using a GCIB. By adjusting the orientation of the substrate relative to the GCIB, material growth may proceed on surfaces that are substantially perpendicular to the incident GCIB while material growth may be avoided or reduced on surfaces that are substantially parallel with the incident GCIB.

Herein, the term "growth" is defined and used in a manner to distinguish from the term "deposition". During growth, a thin film is formed on a substrate, wherein only a fraction of the atomic constituents of the thin film are introduced in the GCIB and the remaining fraction is provided by the substrate upon which the thin film is grown. For example, when growing $SiO_x$ on a substrate, the substrate may comprise a silicon surface, which is irradiated by a GCIB containing oxygen. To the contrary, during deposition, a thin film is formed on a substrate, wherein substantially all of the atomic constituents of the thin film are introduced in the GCIB. For example, when depositing $SiC_x$, the substrate is irradiated by a GCIB containing both silicon and carbon.

Therefore, according to one embodiment, a method of forming a thin film on a substrate is described. The method comprises providing a substrate in a reduced-pressure environment, and generating a GCIB in the reduced-pressure environment from a pressurized gas mixture. A beam acceleration potential and a beam dose are selected to achieve a thickness of the thin film ranging up to about 300 angstroms and to achieve a surface roughness of an upper surface of the thin film that is less than about 20 angstroms. The GCIB is accelerated according to the beam acceleration potential, and the accelerated GCIB is irradiated onto at least a portion of the substrate according to the beam dose. By doing so, the thin film is grown on the irradiated portion of the substrate to achieve the thickness and the surface roughness.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface per unit area (i.e., number of clusters per unit area per unit time) may be held constant while the time is varied to change the beam dose.

Additionally, other GCIB properties may be varied to adjust the film thickness and/or the surface roughness of the thin film including, but not limited to, gas flow rate, stagnation pressure, cluster size, or gas nozzle design (such as nozzle throat diameter, nozzle length, and/or nozzle divergent section half-angle). Furthermore, other film properties may be varied by adjusting the GCIB properties including, but not limited to, film density, film quality, etc.

According to another embodiment, a method of forming a thin film on a substrate is described. The method comprises providing a substrate in a reduced-pressure environment, and generating a GCIB in the reduced-pressure environment from a pressurized gas mixture. A beam acceleration potential and a beam dose is selected to achieve a thickness of the thin film and/or to achieve a surface roughness of an upper surface of the thin film. The GCIB is accelerated according to the beam acceleration potential, a beam energy distribution for the GCIB is modified, and the modified, accelerated GCIB is irradiated onto at least a portion of the substrate according to the beam dose. In doing so, the thin film is grown on the irradiated portion of the substrate to achieve the thickness and the surface roughness.

Referring now to the drawings wherein like reference numerals designate corresponding parts throughout the several views, a GCIB processing system 100 for forming the thin films as described above is depicted in FIG. 1 according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a gas cluster ion beam can be formed in the second chamber (ionization/acceleration chamber 106) wherein the gas cluster beam is ionized and accelerated. Then, in the third chamber (processing chamber 108), the accelerated gas cluster ion beam may be utilized to treat substrate 152.

As shown in FIG. 1, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Furthermore, for example, the first gas composition or the second gas composition or both can comprise a film-forming gas composition. Further yet, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The film-forming composition can comprise a film precursor or precursors that include the principal atomic or molecular species of the film desired to be produced or grown on the substrate.

When growing a thin film, the pressurized gas mixture from the first gas source 111 and/or the second gas source 112 may comprise an oxygen-containing gas, a nitrogen-containing gas, a carbon-containing gas, a hydrogen-containing gas, a silicon-containing gas, a germanium-containing gas, or an optional inert gas, or a combination of two or more thereof. For example, when growing an oxide or performing an oxidation process, the pressurized gas mixture may comprise an oxygen-containing gas, such as $O_2$. Additionally or alternatively, for example, the pressurized gas mixture may comprise $O_2$, $N_2$, NO, $NO_2$, $N_2O$, CO, or $CO_2$, or any combination of two or more thereof. Additionally, for example, the optional inert gas may comprise a noble gas.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam electronics 130 further include an anode power supply 134 that provides voltage $V_A$ to an anode of ionizer 122 for accelerating electrons emitted from filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
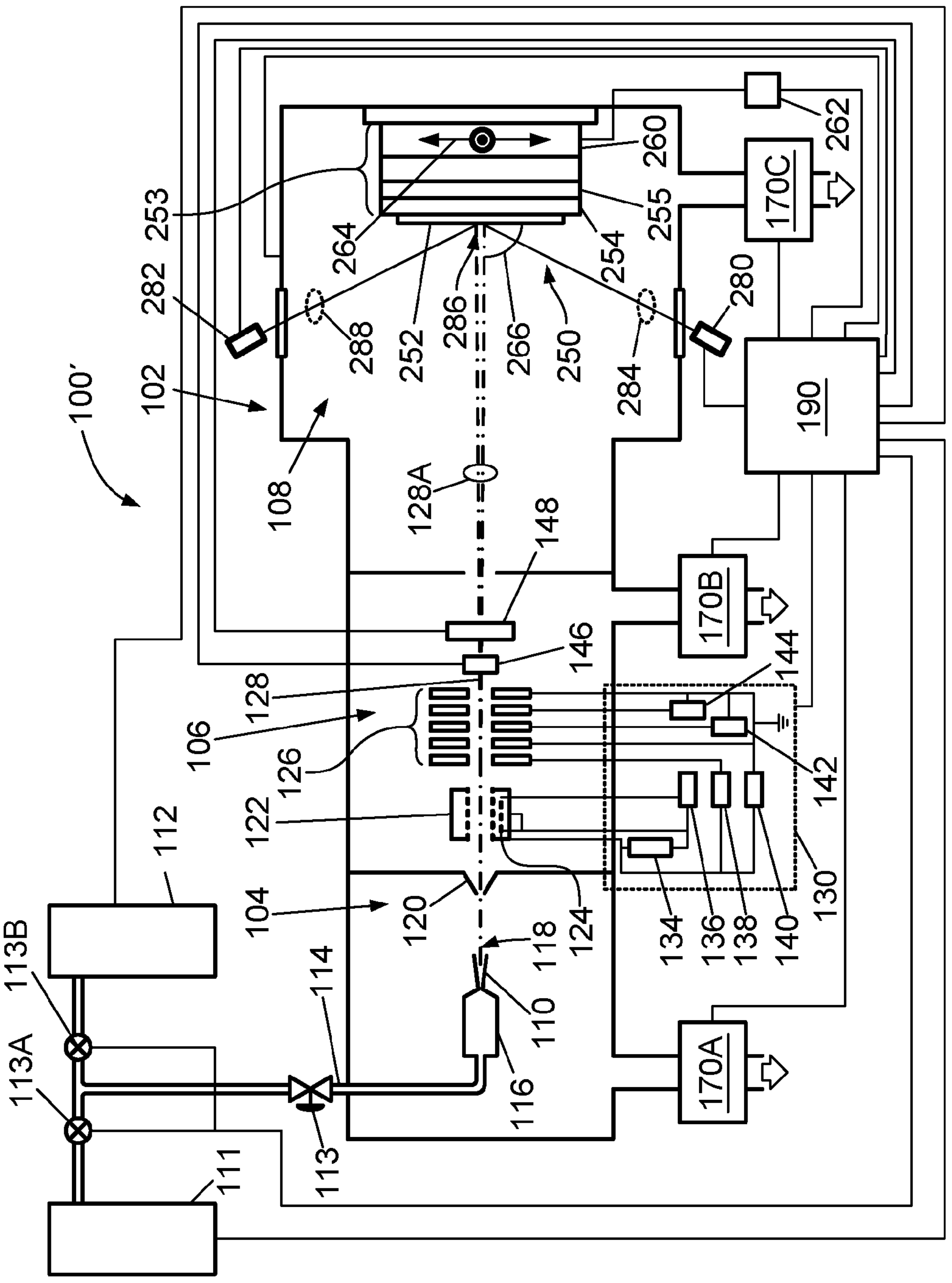
FIG. 2 is another illustration of a GCIB processing system.

In the embodiment shown in FIG. 2, the GCIB processing system 100 can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the substrate 252 surface. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 1) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the gas cluster ion beam with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 3:
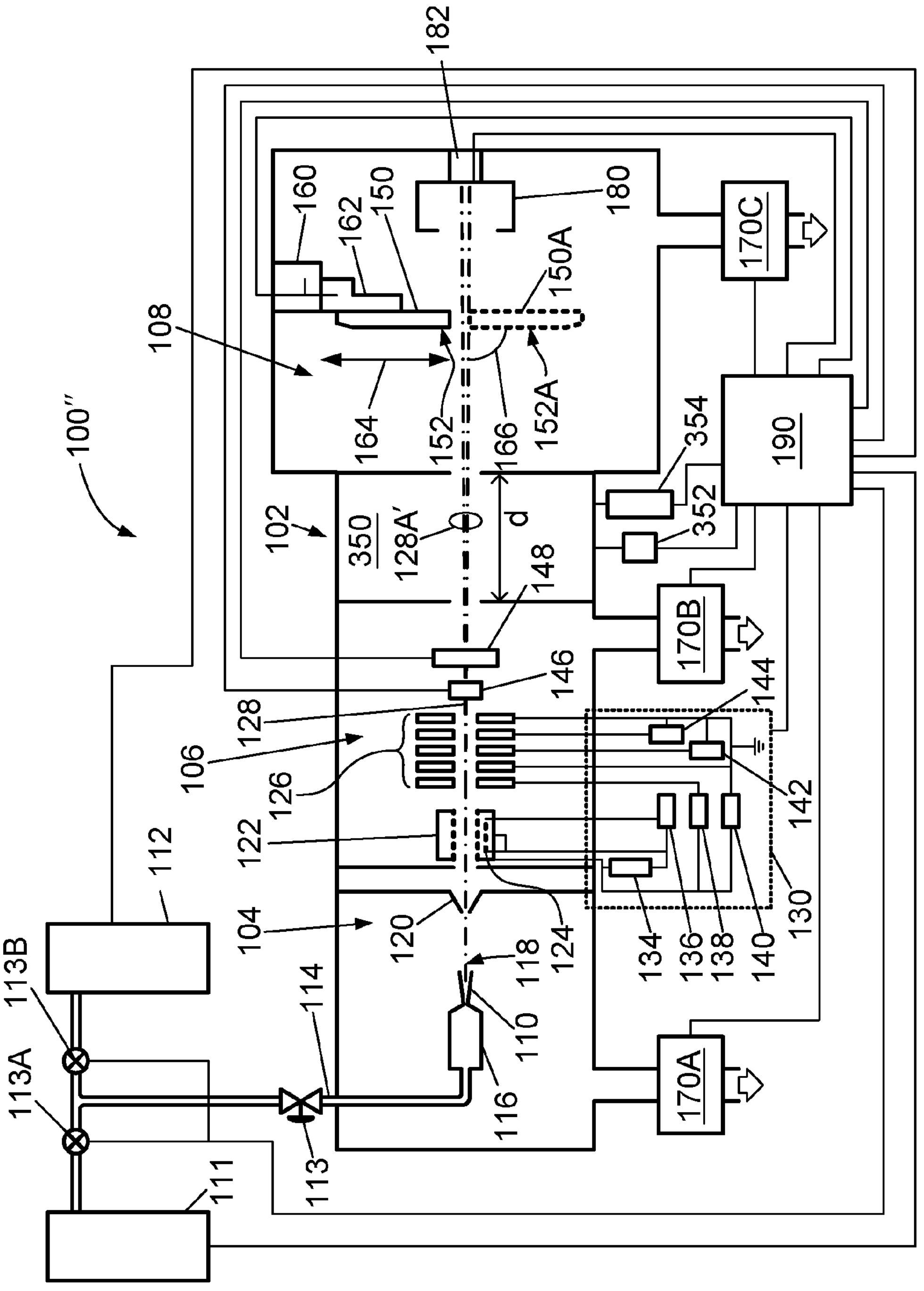
FIG. 3 is yet another illustration of a GCIB processing system.

In the embodiment shown in FIG. 3, the GCIB processing system 100" can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configure to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100") a as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mtorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 4:
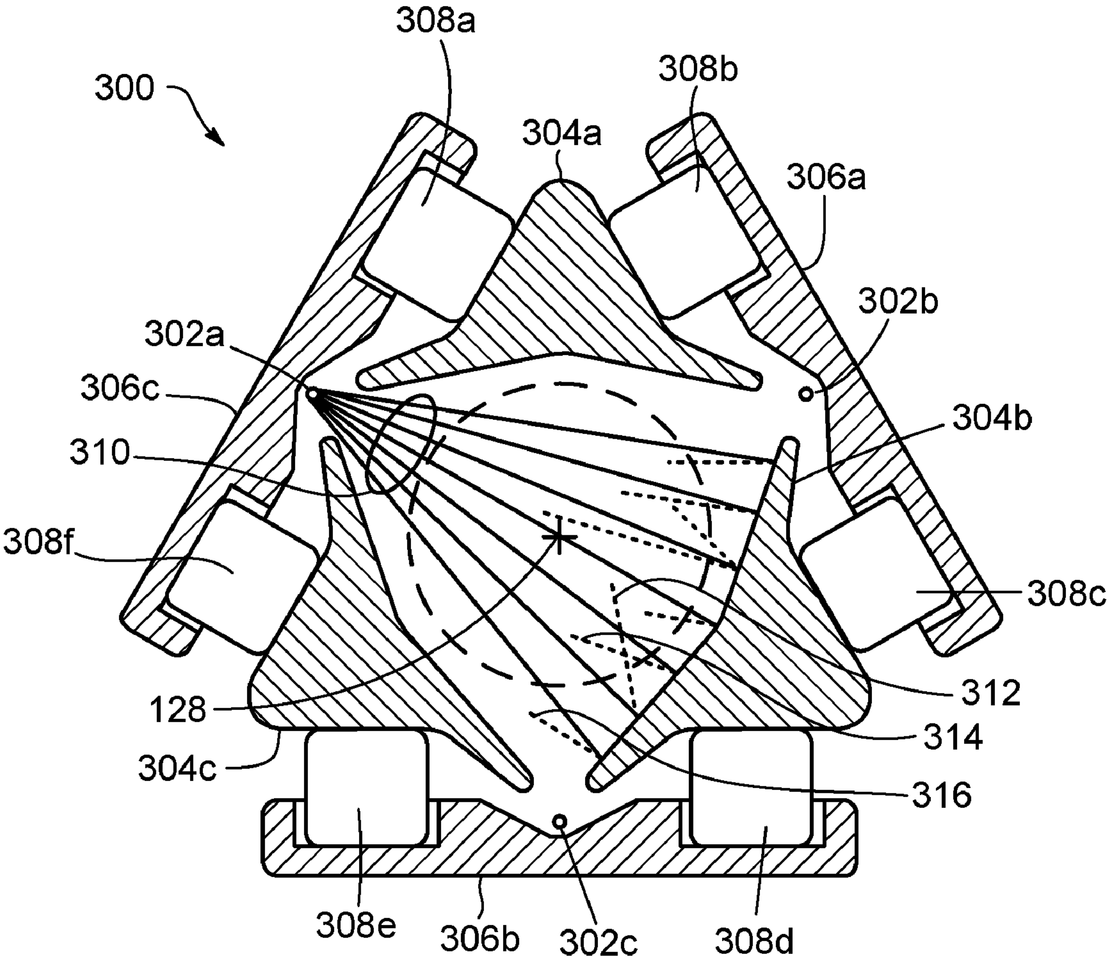
FIG. 4 is an illustration of an ionization source for a GCIB processing system.

Referring now to FIG. 4, a section 300 of a gas cluster ionizer (122, FIGS. 1, 2 and 3) for ionizing a gas cluster jet (gas cluster beam 118, FIGS. 1, 2 and 3) is shown. The section 300 is normal to the axis of GCIB 128. For typical gas cluster sizes (2000 to 15000 atoms), clusters leaving the skimmer aperture (120, FIGS. 1, 2 and 3) and entering an ionizer (122, FIGS. 1, 2 and 3) will travel with a kinetic energy of about 130 to 1000 electron volts (eV). At these low energies, any departure from space charge neutrality within the ionizer 122 will result in a rapid dispersion of the jet with a significant loss of beam current. FIG. 4 illustrates a self-neutralizing ionizer. As with other ionizers, gas clusters are ionized by electron impact. In this design, thermo-electrons (seven examples indicated by 310) are emitted from multiple linear thermionic filaments 302*a*, 302*b*, and 302*c* (typically tungsten) and are extracted and focused by the action of suitable electric fields provided by electron-repeller electrodes 306*a*, 306*b*, and 306*c* and beam-forming electrodes 304*a*, 304*b*, and 304*c*. Thermo-electrons 310 pass through the gas cluster jet and the jet axis and then strike the opposite beam-forming electrode 304*b* to produce low energy secondary electrons (312, 314, and 316 indicated for examples).

Though (for simplicity) not shown, linear thermionic filaments 302*b* and 302*c* also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304*a*, 304*b*, and 304*c* are biased positively with respect to linear thermionic filaments 302*a*, 302*b*, and 302*c* and electron-repeller electrodes 306*a*, 306*b*, and 306*c* are negatively biased with respect to linear thermionic filaments 302*a*, 302*b*, and 302*c*. Insulators 308*a*, 308*b*, 308*c*, 308*d*, 308*e*, and 308*f* electrically insulate and support electrodes 304*a*, 304*b*, 304*c*, 306*a*, 306*b*, and 306*c*. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled "Ionizer and method for gas-cluster ion-beam formation"; the content of which is incorporated herein by reference in its entirety.

The gas cluster ionizer (122, FIGS. 1, 2 and 3) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

According to an embodiment, a GCIB is utilized to grow a thin film on a surface of a substrate. For example, the GCIB may be generated using any one of the GCIB processing systems (100, 100', or 100", or combinations thereof) depicted in FIGS. 1, 2 and 3. The forming of a thin film may include oxidation, nitridation, or oxynitridation of a substrate or layer on a substrate. Additionally, the forming of a thin film may include growing a $SiO_x$, $SiN_x$, $SiC_x$, $SiO_xN_y$, or $SiC_xN_y$ film on a substrate or layer on a substrate. Additionally yet, the forming of a thin film may include growing a germanide. According to embodiments of the invention, the pressurized gas mixture may thus comprise an oxygen-containing gas, a nitrogen-containing gas, a carbon-containing gas, a hydrogen-containing gas, a silicon-containing gas, or a germanium-containing gas, or a combination of two or more thereof.

When forming an oxide such as $SiO_x$, a substrate comprising silicon or a silicon-containing material may be irradiated by a GCIB formed from a pressurized gas mixture having an oxygen-containing gas. For example, the pressurized gas mixture may comprise $O_2$. In another example, the pressurized gas mixture may comprise $O_2$, NO, $NO_2$, $N_2O$, CO, or $CO_2$, or any combination of two or more thereof.

When forming a nitride such as $SiN_x$, a substrate comprising silicon or a silicon-containing material may be irradiated by a GCIB formed from a pressurized gas mixture having a nitrogen-containing gas. For example, the pressurized gas mixture may comprise $N_2$. In another example, the pressurized gas mixture may comprise $N_2$, NO, $NO_2$, $N_2O$, or $NH_3$, or any combination of two or more thereof.

When forming a carbide such as $SiC_x$, a substrate comprising silicon or a silicon-containing material, may be irradiated by a GCIB formed from a pressurized gas mixture having a carbon-containing gas. For example, the pressurized gas mixture may comprise $CH_4$. In another example, the pressurized gas mixture may comprise $CH_4$ (or more generally a hydrocarbon gas, i.e., $C_xH_y$), CO, or $CO_2$, or any combination of two or more thereof.

When forming an oxynitride such as $SiO_xN_y$, a substrate comprising silicon or a silicon-containing material may be irradiated by a GCIB formed from a pressurized gas mixture having an oxygen-containing gas and a nitrogen-containing gas. For example, the pressurized gas mixture may comprise $O_2$and $N_2$, NO, $NO_2$, or $N_2O$, or any combination of two or more thereof.

When forming a carbonitride such as $SiC_xN_y$, a substrate comprising silicon or a silicon-containing material may be irradiated by a GCIB formed from a pressurized gas mixture having a carbon-containing gas and a nitrogen-containing gas. For example, the pressurized gas mixture may comprise $CH_4$ and $N_2$.

When forming a germanide such as SiGe, a substrate comprising silicon or a silicon-containing material may be irradiated by a GCIB formed from a pressurized gas mixture having a germanium-containing gas. For example, the pressurized gas mixture may comprise $GeH_4$ or $Ge_2H_6$ or both.

In any one of the above examples, the pressurized gas mixture may comprise an optional inert gas. The optional inert gas may comprise a noble gas.

Figure 5:
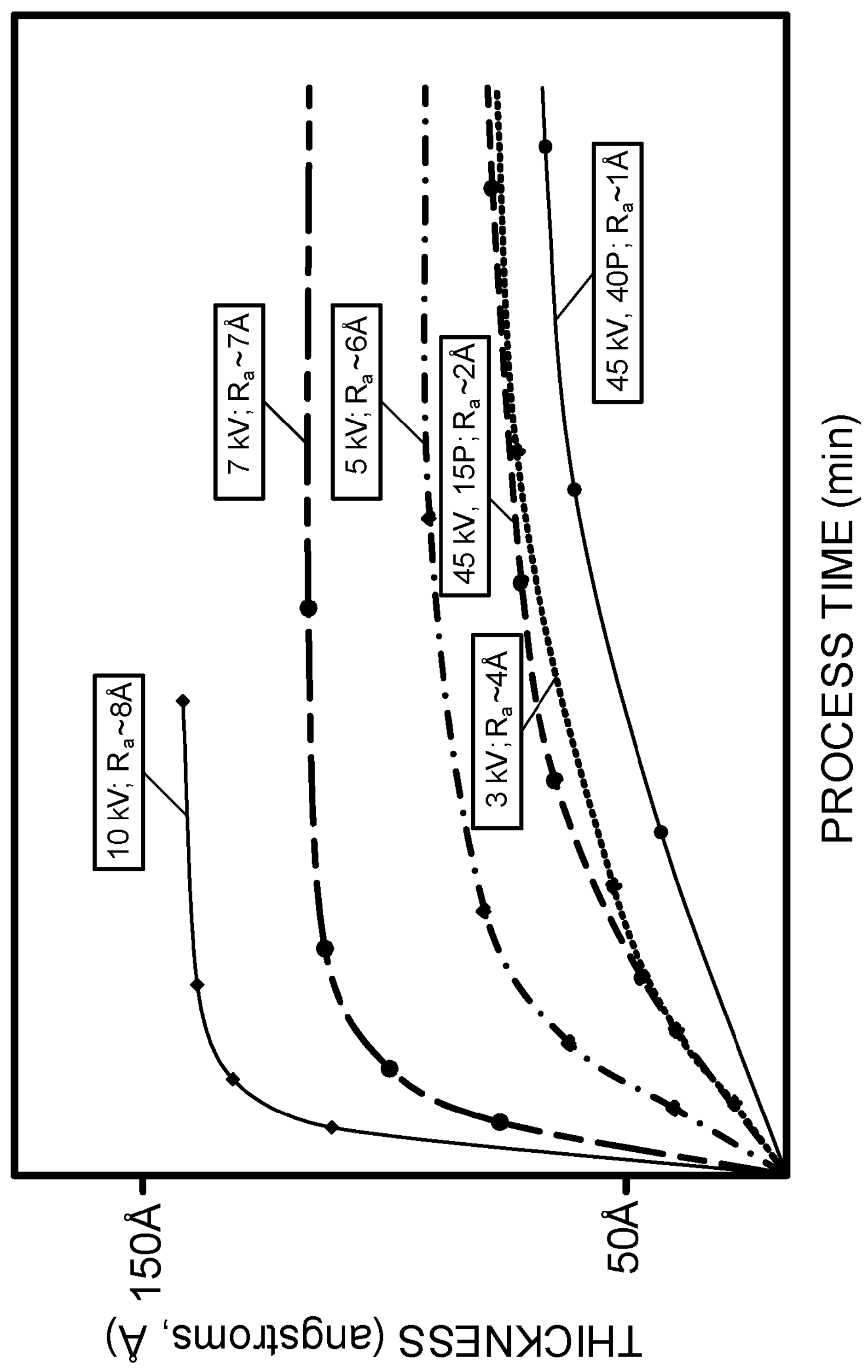
FIGS. 5-10 are graphs that each provide exemplary data for thin film growth using a GCIB.

According to an example, $SiO_2$ is grown on a silicon substrate by irradiating the substrate with a GCIB formed from a pressurized gas mixture containing $O_2$. Film thickness (measured in angstroms, Å) and surface roughness (measured in angstroms, Å) are collected and provided in FIGS. 5 and 6 (an exploded view of FIG. 5). The data provided in FIG. 5 is obtained using a GCIB processing system having a three (3)-electrode beam line. For example, the set of suitably biased high voltage electrodes, illustrated in FIGS. 1 through 3, include a three electrode arrangement having an extraction electrode (positively biased), a suppression electrode (negatively biased) and a ground electrode.

The film thickness of the grown film is provided as a function of the beam acceleration potential (i.e., beam energy, in kV) and process time (measured in minutes, min) (i.e., beam dose). In each case, the thickness increases as a function of process time (or beam dose) until it eventually saturates. The maximum thickness and the elapsed process time associated with substantially achieving the maximum thickness depend on the beam acceleration potential. As the beam acceleration is increased, the maximum thickness is increased and the time to achieve the maximum thickness is decreased. Conversely, as the beam acceleration is decreased, the maximum thickness is decreased and the time to achieve the maximum thickness is increased.

Additionally, the surface roughness (average roughness, $R_a$) depends on the beam acceleration potential. As the beam acceleration is increased, the surface roughness is increased. Conversely, as the beam acceleration is decreased, the surface roughness is decreased.

Furthermore, for a given film thickness, the surface roughness may be decreased by modifying the beam energy distribution function. With the exception of two data sets, each data set is acquired using a GCIB processing system without modification of the beam energy distribution function, e.g., without a pressure cell having an increased pressure region through which the GCIB passes. In the case of the two exceptions, the beam energy distribution function of the GCIB is modified by directing the GCIB along a GCIB path through an increased pressure. In one case, the path length (d) of the pressure cell is set to d~23.3 cm and the pressure in the pressure cell is elevated by introducing a background gas at a flow rate of 15 sccm (standard cubic centimeters per minute) ("15P") (or the pressure-distance integral is about 0.002 torr-cm) to the pressure cell. The corresponding data set is acquired for a beam acceleration potential of about 45 kV (see dashed line, solid circles in FIG. 5). As shown in FIG. 5, the modification of the beam energy distribution function may be used to reduce the surface roughness while maintaining about the same film thickness (by increasing the beam acceleration potential). In the other case, the pressure in the pressure cell is raised by introducing a background gas at a flow rate of 40 sccm ("40P") (or the pressure-distance integral is about 0.005 torr-cm) to the pressure cell. Since the beam acceleration potential (45 kV) remains constant, both the film thickness and the surface roughness decrease.

Figure 6:
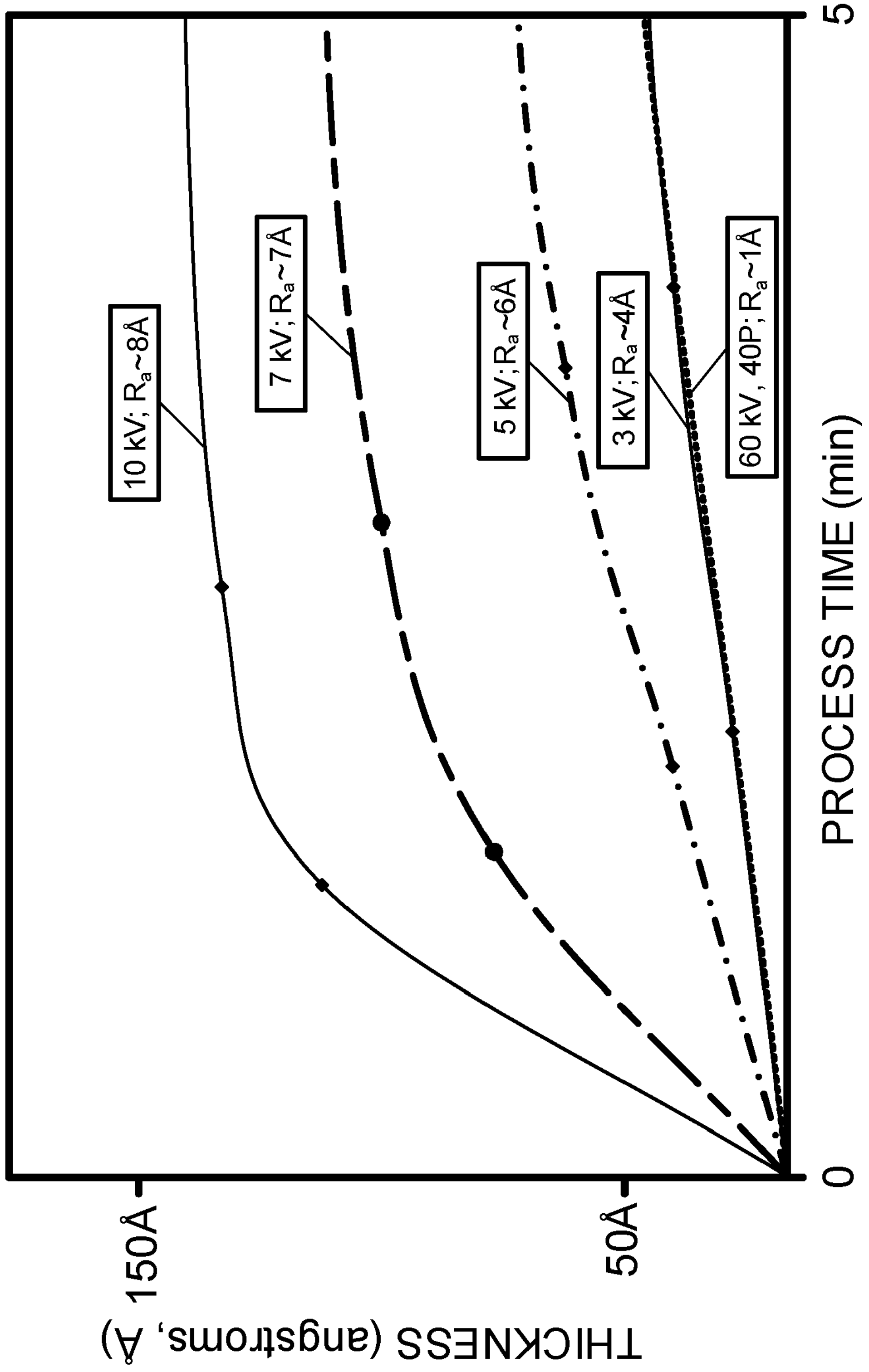

In FIG. 6, the beam acceleration is increased to 60 kV and the pressure in the pressure cell is set to "40P". The resultant film thickness as a function of process time nearly coincides with the film thickness measured for a 3 kV beam acceleration potential without the use of the pressure cell. However, with the use of the pressure cell, the surface roughness is reduced from about 4 Å to about 1 Å.

Figure 7:
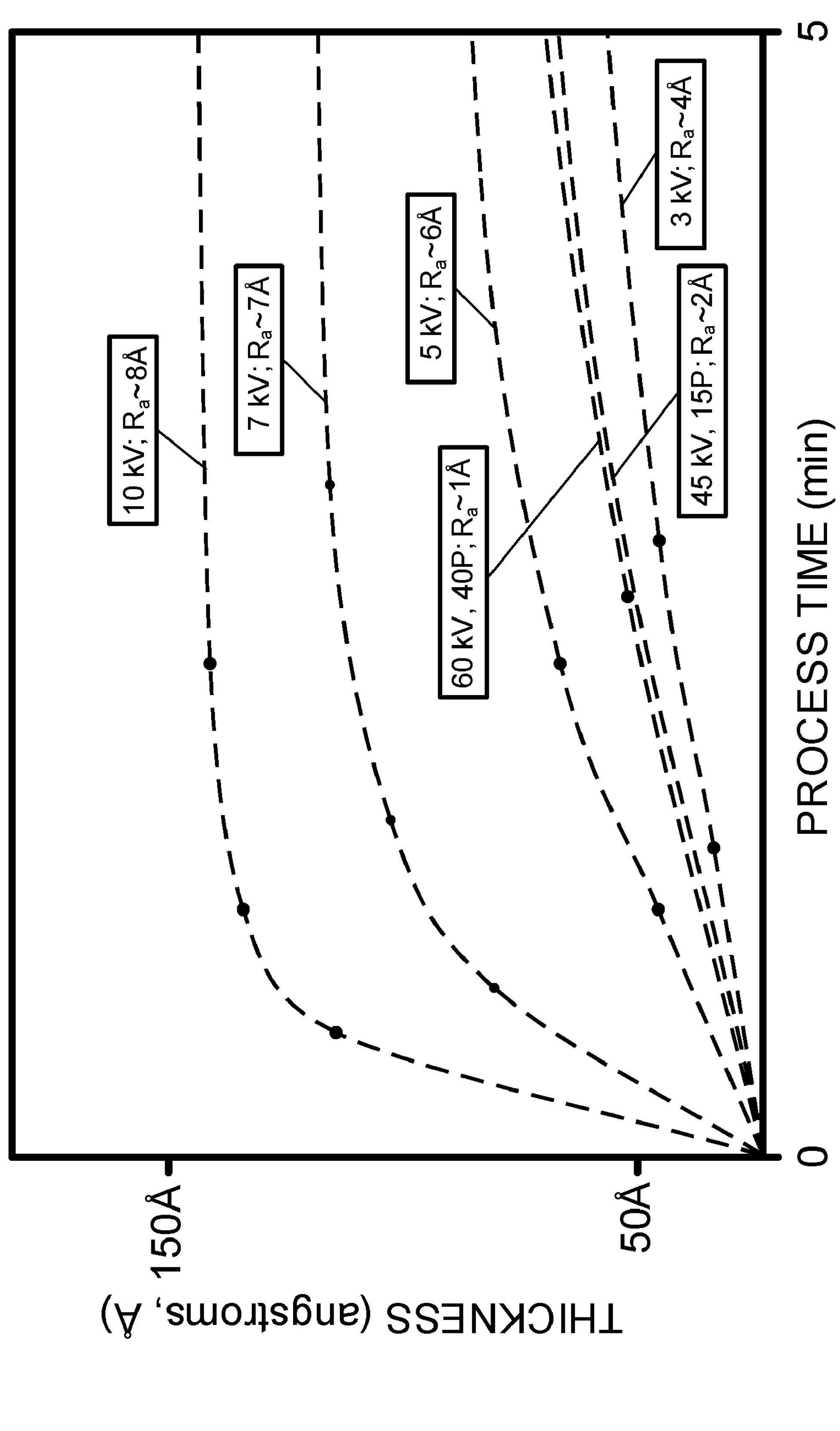

According to another example, $SiO_2$ is grown on a silicon substrate by irradiating the substrate with a GCIB formed from a pressurized gas mixture containing $O_2$. Film thickness (measured in angstroms, Å) and surface roughness (measured in angstroms, Å) are collected and provided in FIG. 7. The data provided in FIG. 7 is similar to that of FIG. 5; however, the data is obtained using a GCIB processing system having a five (5)-electrode beam line. For example, the set of suitably biased high voltage electrodes resemble the electrode system illustrated in FIGS. 1 through 3.

As shown in FIG. 7, the thickness increases as a function of process time (or beam dose) until it eventually saturates. The maximum thickness and the elapsed process time associated with substantially achieving the maximum thickness depend on the beam acceleration potential. Additionally, the surface roughness (average roughness, $R_a$) depends on the beam acceleration potential. As the beam acceleration is increased, the surface roughness is increased. Conversely, as the beam acceleration is decreased, the surface roughness is decreased.

Figure 8:
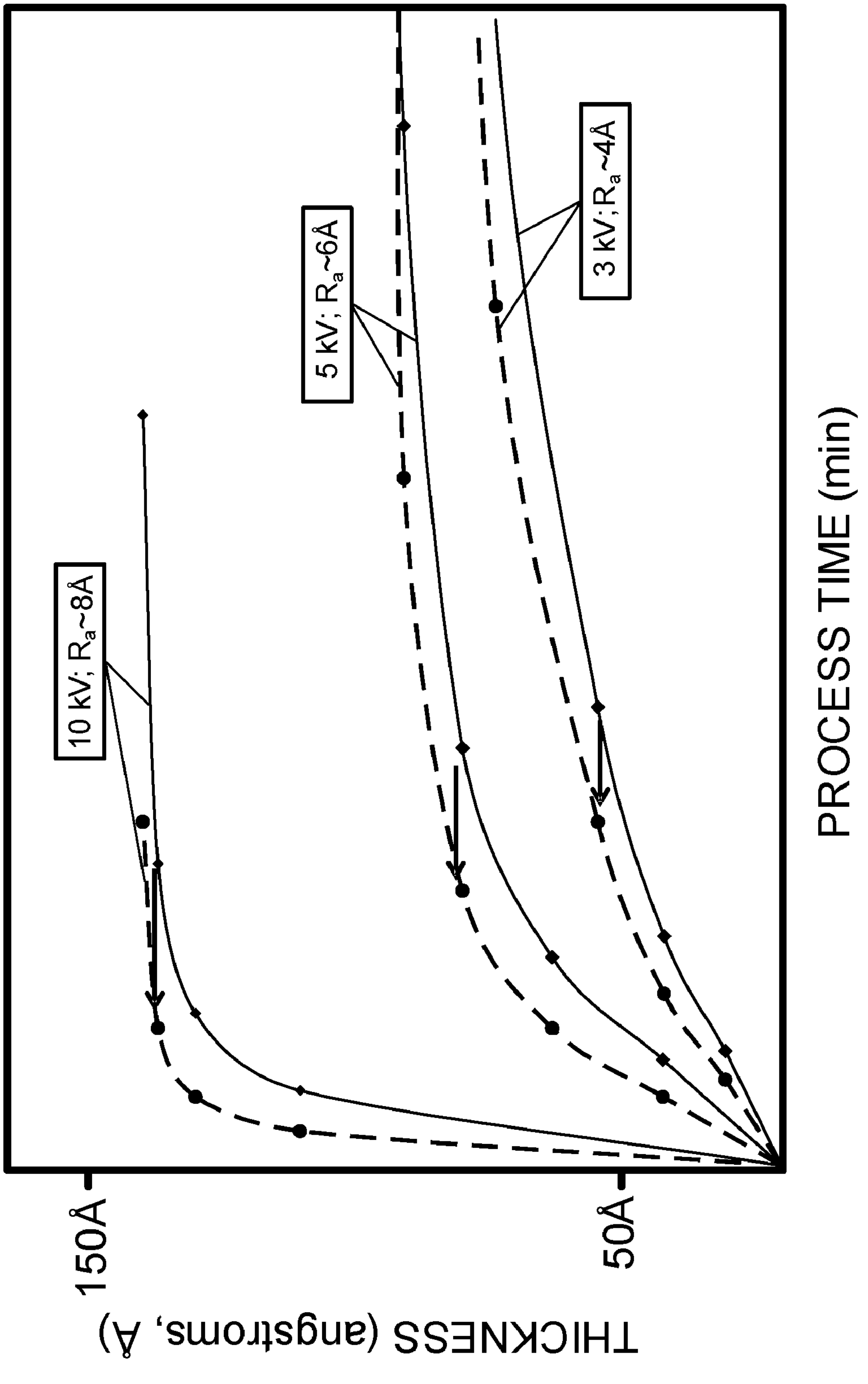
Figure 9:
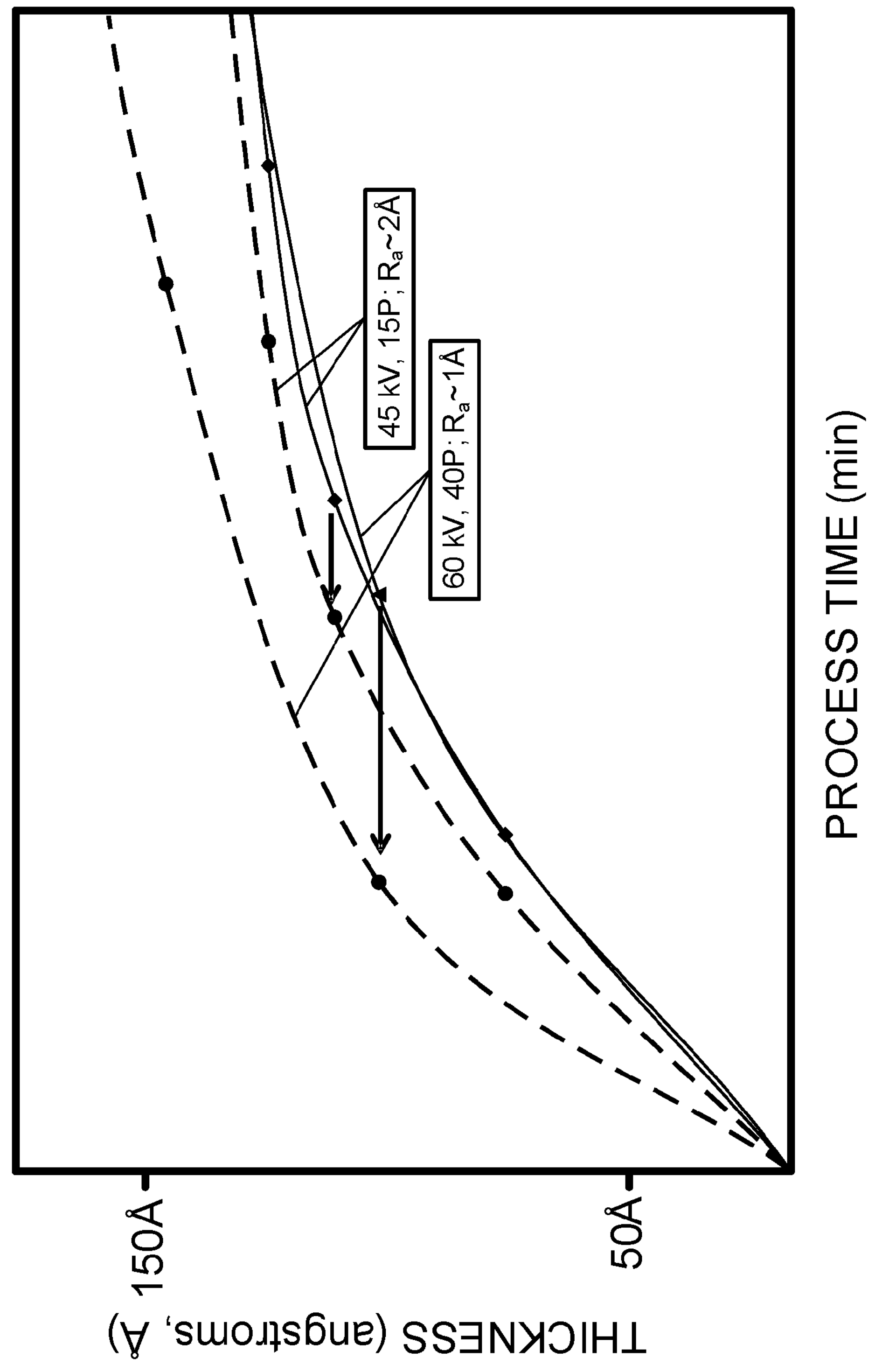
Figure 10:
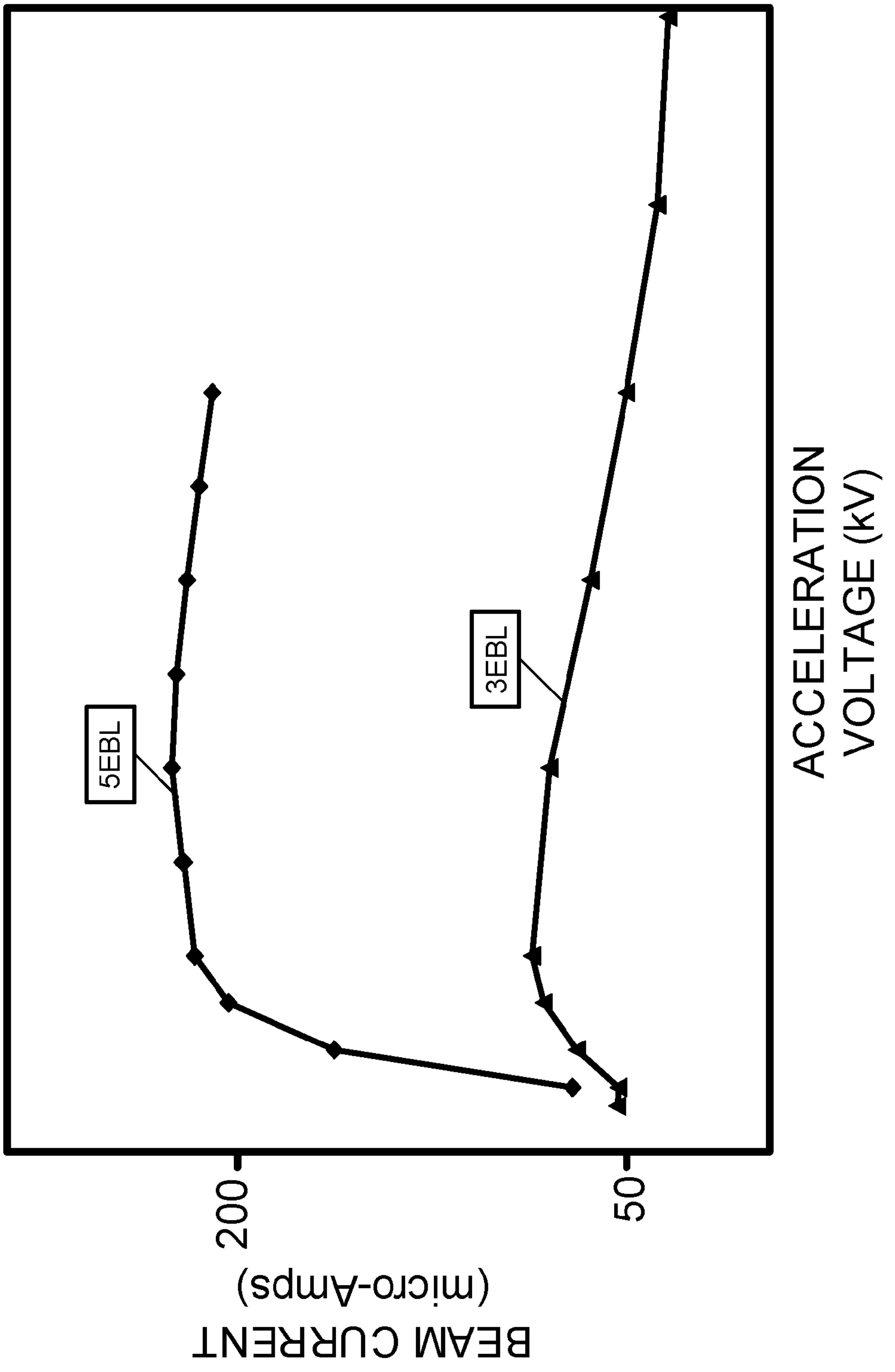

In FIG.8, the film thickness as a function of process time is compared for the 3-electrode beam line (solid line data) and the 5-electrode beam line (dashed line data) without a pressure cell. In FIG. 9, the film thickness as a function of process time is compared for the 3-electrode beam line (solid line data) and the 5-electrode beam line (dashed line data) with a pressure cell. In both data sets, the maximum film thickness is substantially achieved with less process time using the 5-electrode beam line (i.e. data shifts to the left). One possible reason for this observation may be the increase in beam current achieved using the 5-electrode beam line. FIG. 10 provides the beam current (measured in micro-Amps) as a function of the beam acceleration voltage for the 5-electrode beam line ("5EBL", solid diamonds) and the 3-electrode beam line ("3EBL", solid triangles).

Figure 11:
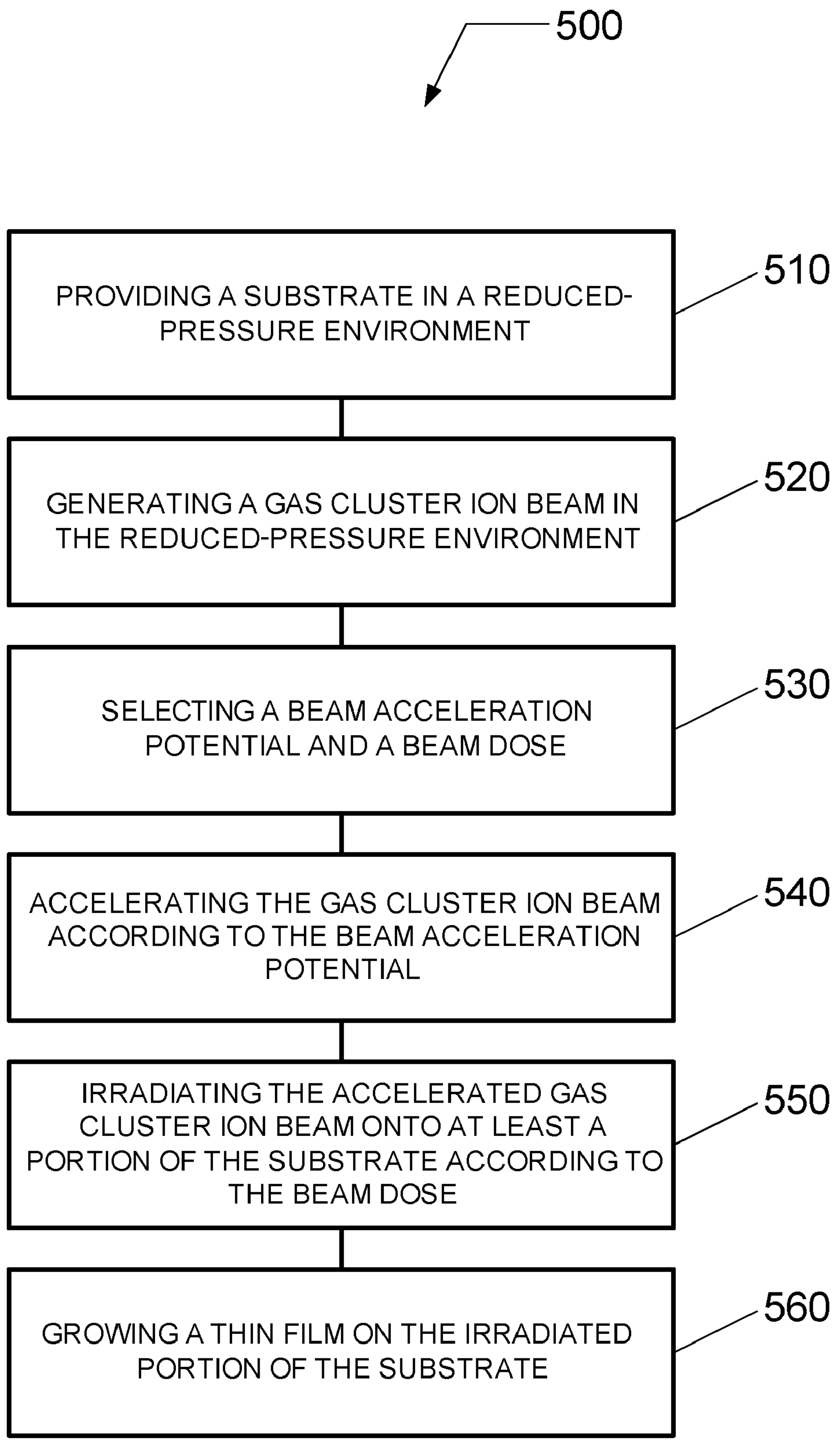
FIG. 11 is a flow chart illustrating a method for forming a thin film using a GCIB according to an embodiment.

Referring to FIG. 11, a method of forming a thin film on a substrate using a GCIB is illustrated according to an embodiment. The method comprises a flow chart 500 beginning in 510 with providing a substrate in a reduced-pressure environment. The substrate can be disposed in a GCIB processing system. The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure.

The GCIB processing system can be any of the GCIB processing systems (100, 100' or 100") described above in FIGS. 1, 2 or 3, or any combination thereof. The substrate can include a conductive material, a non-conductive material, or a semi-conductive material, or a combination of two or more materials thereof. Additionally, the substrate may include one or more material structures formed thereon, or the substrate may be a blanket substrate free of material structures.

In 520, a GCIB is generated in the reduced-pressure environment. The GCIB can be generated from a pressurized gas mixture having oxygen and an optional inert gas. However, other gases or gas mixtures may be used, as described above.

In 530, a beam acceleration potential and a beam dose can be selected. The beam acceleration potential and the beam dose can be selected to achieve a thickness of the thin film ranging from up to about 300 angstroms or more, and to achieve a surface roughness of an upper surface of the thin film that is less than about 20 angstroms. According to various embodiments, the beam acceleration potential and the beam dose can be selected to achieve a minimum thickness for the thin film. By way of example, and not limitation, the minimum thickness may be about 1 nm or more, for example about 5 nm or more.

The beam acceleration potential may range up to 100 kV, and the beam dose may range up to about $1\times10^{16}$ clusters per $cm^2$. Alternatively, the beam acceleration potential may range up to 10 kV, and the beam dose may range up to about $2\times10^{14}$ clusters per $cm^2$. When growing a $SiO_2$ thin film, a beam acceleration potential of about 10 kV and a beam dose of about $2\times10^{14}$ clusters per $cm^2$ can achieve a film thickness of about 140 angstroms and a surface roughness of about 8 angstroms or less. Alternatively, the beam acceleration potential may range up to 7 kV, and the beam dose may range up to about $2\times10^{14}$ clusters per $cm^2$. When growing a $SiO_2$ thin film, a beam acceleration potential of about 7 kV and a beam dose of about $2\times10^{14}$ clusters per $cm^2$ can achieve a film thickness of about 115 angstroms and a surface roughness of about 7 angstroms or less. Alternatively, the beam acceleration potential may range up to 5 kV, and the beam dose may range up to about $2\times10^{14}$ clusters per $cm^2$. When growing a $SiO_2$ thin film, a beam acceleration potential of about 5 kV and a beam dose of about $2\times10^{14}$ clusters per $cm^2$ can achieve a film thickness of about 80 angstroms and a surface roughness of about 6 angstroms or less. Alternatively yet, the beam acceleration potential may range up to 3 kV, and the beam dose may range up to about $2\times10^{14}$ clusters per $cm^2$. When growing a $SiO_2$ thin film, a beam acceleration potential of about 3 kV and a beam dose of about $2\times10^{14}$ clusters per $cm^2$ can achieve a film thickness of about 55 angstroms and a surface roughness of about 3 angstroms or less. Alternatively yet, the beam acceleration potential may range up to 2 kV, and the beam dose may range up to about $2\times10^{14}$ clusters per $cm^2$. When growing a $SiO_2$ thin film, a beam acceleration potential of about 2 kV and a beam dose of about $2\times10^{14}$ clusters per $cm^2$ can achieve a film thickness of about 25 angstroms and a surface roughness of about 2 angstroms or less. Alternatively yet, the beam acceleration potential may range up to 70 kV, the beam dose may range up to about $2\times10^{14}$ clusters per $cm^2$, and the pressure-path length integral (for a pressure cell) may range up to 0.005 torr-cm. When growing a $SiO_2$ thin film, a beam acceleration potential of about 70 kV, a beam dose of about $2\times10^{14}$ clusters per $cm^2$, and a pressure-path length integral of about 0.005 torr-cm can achieve a film thickness up to about 70 angstroms and a surface roughness of about 1 angstroms or less. Alternatively yet, the beam acceleration potential may range up to 70 kV, the beam dose may range up to about $2\times10^{14}$ clusters per $cm^2$, and the pressure-path length integral (for a pressure cell) may range up to 0.002 torr-cm. When growing a $SiO_2$ thin film, a beam acceleration potential of about 70 kV, a beam dose of about $2\times10^{14}$ clusters per $cm^2$, and a pressure-path length integral of about 0.002 torr-cm can achieve a film thickness up to about 70 angstroms and a surface roughness of about 2 angstroms or less.

In 540, the GCIB is accelerated according to the beam acceleration potential.

In 550, the accelerated GCIB is irradiated onto at least a portion of the substrate according to the beam dose.

In 560, a thin film is grown on the at least a portion (i.e., the irradiated portion) of the substrate. The at least a portion of the substrate may comprise silicon, wherein the grown thin film comprises $SiO_2$.

Figure 12:
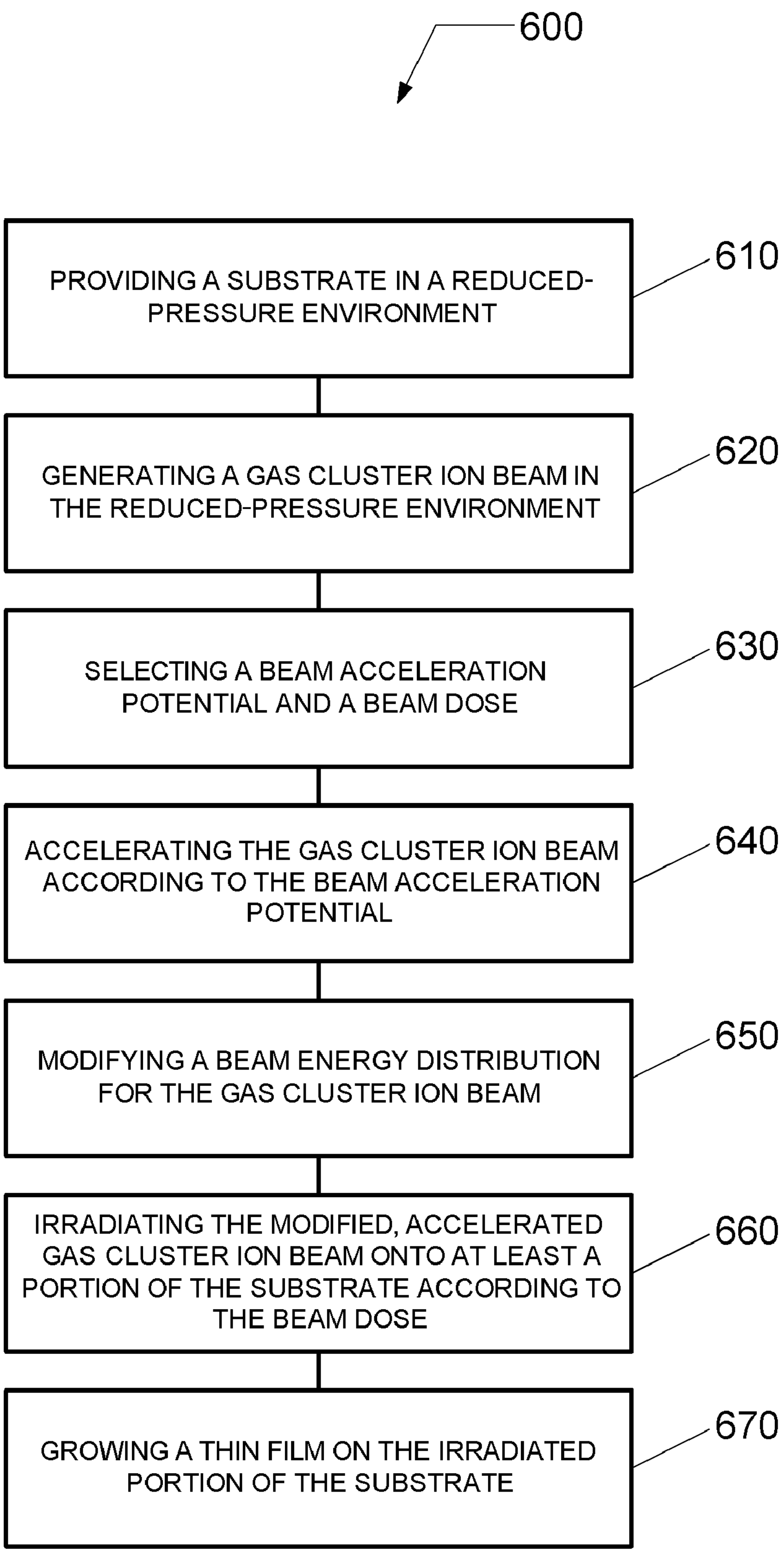
FIG. 12 is a flow chart illustrating a method for forming a thin film using a GCIB according to another embodiment.

Referring to FIG. 12, a method of forming a thin film on a substrate using a GCIB is illustrated according to another embodiment. The method comprises a flow chart 600 beginning in 610 with providing a substrate in a reduced-pressure environment. The substrate can be disposed in a GCIB processing system. The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure.

The GCIB processing system can be any of the GCIB processing systems (100, 100' or 100") described above in FIGS. 1, 2 or 3, or any combination thereof. The substrate can include a conductive material, a non-conductive material, or a semi-conductive material, or a combination of two or more materials thereof. Additionally, the substrate may include one or more material structures formed thereon, or the substrate may be a blanket substrate free of material structures.

In 620, a GCIB is generated in the reduced-pressure environment. The GCIB may be generated from a pressurized gas mixture having oxygen and an optional inert gas. However, other gases may be used depending on the composition of the thin film to be grown on the substrate.

In 630, a beam acceleration potential and a beam dose can be selected. The beam acceleration potential and the beam dose can be selected to achieve a thickness of the thin film ranging up to about 300 angstroms and to achieve a surface roughness of an upper surface of the thin film that is less than about 20 angstroms. The beam acceleration potential may range up to 100 kV, and the beam dose may range up to about $1\times10^{16}$ clusters per $cm^2$.

In 640, the GCIB is accelerated according to the beam acceleration potential.

In 650, a beam energy distribution function of the GCIB is modified. In one embodiment, the beam energy distribution function for the GCIB is modified by directing the GCIB along a GCIB path through an increased pressure such that at least a portion of the GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to decrease the surface roughness of the thin film, or one may narrow the beam energy distribution to increase the surface roughness of the thin film.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm.

In another embodiment, the beam energy distribution function for the GCIB is modified by modifying or altering a charge state of the GCIB. For example, the charge state may be modified by adjusting an electron flux, an electron energy, or an electron energy distribution for electrons utilized in electron collision-induced ionization of gas clusters.

In 660, the accelerated GCIB is irradiated onto at least a portion of the substrate according to the beam dose.

In 670, a thin film is grown on the at least a portion (i.e., the irradiated portion) of the substrate. The at least a portion of the substrate may comprise silicon, wherein the grown thin film comprises $SiO_2$.

Figure 13:
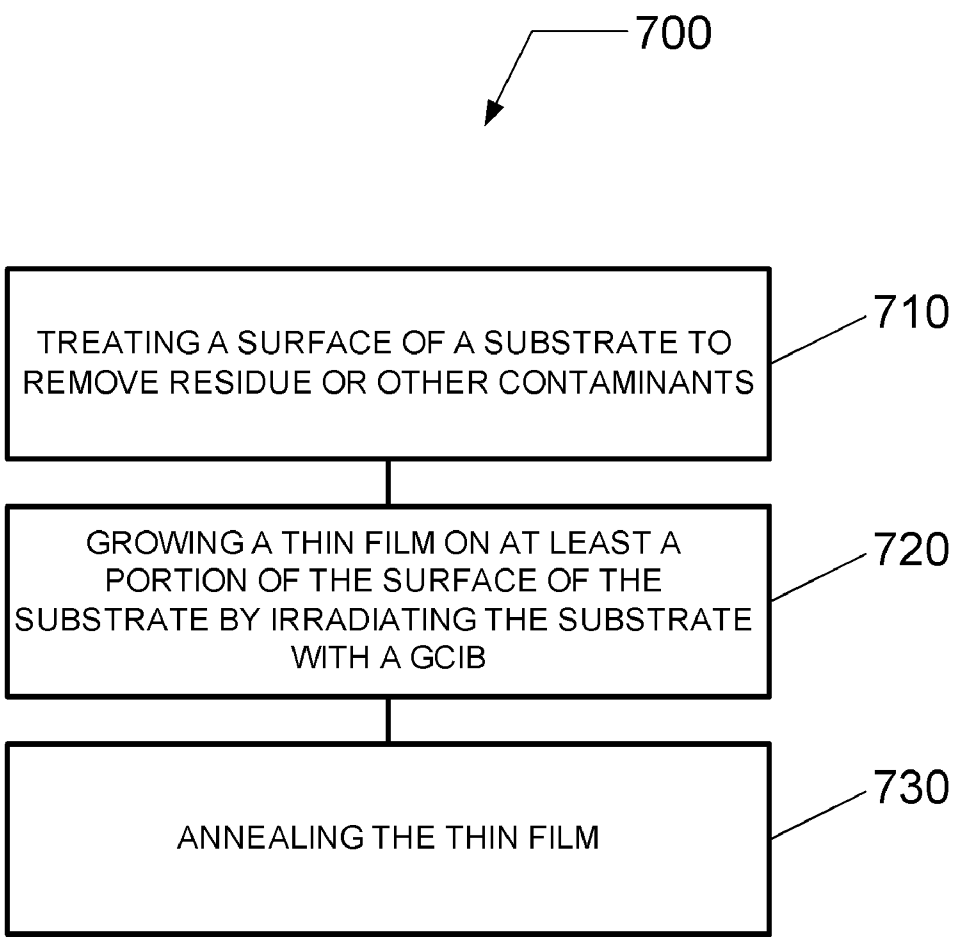
FIG. 13 is a flow chart illustrating a method for forming a thin film using a GCIB according to another embodiment.

Referring to FIG. 13, a method of forming a thin film on a substrate using a GCIB is illustrated according to another embodiment. The method comprises a flow chart 700 beginning in 710 with optionally treating a surface of said substrate to remove residue or other contaminants. The treatment step may include a cleaning or pre-cleaning step. Additionally, the treatment step may include a dry or wet treatment process. Furthermore, the treatment step may include a plasma or non-plasma treatment process. Further yet, the treatment step may be performed in-situ or ex-situ to subsequent steps.

In 720, a thin film is grown on at least a portion of the surface of the substrate by irradiating the substrate with a GCIB formed from a pressurized gas mixture. The thin film may include a thin oxide film, and the pressurized gas mixture may include oxygen and an optional inert gas.

In 730, the thin film is annealed. The thin film may be annealed via a thermal treatment, wherein the temperature of the film is elevated to a material-specific temperature for a period of time. The temperature and the time for the annealing process may be adjusted in order to vary film properties. For example, the temperature of the film may be elevated to a value greater than about 800 degrees C. Additionally, for example, the temperature of the film may be elevated to a value greater than about 850 degrees C. Additionally yet, for example, the temperature of the film may be elevated to a value greater than about 900 degrees C. Furthermore, for example, the time for the annealing process may be greater than about 1 millisecond. The annealing process may be performed at atmospheric pressure or reduced pressure. Additionally, the annealing process may be performed with or without an inert gas atmosphere. Furthermore, the annealing process may be performed in a furnace, a rapid thermal annealing (RTP) system, a flash lamp annealing system, or a laser annealing system.

According to yet another embodiment, a GCIB is utilized to selectively deposit material on only chosen surfaces of a substrate. For example, the GCIB can be provided using any one of the GCIB processing systems (100, 100', or 100", or combinations thereof) depicted in FIGS. 1, 2 and 3. By orienting the substrate relative to the direction of incidence of the GCIB, material growth can proceed on one or more surfaces that are substantially perpendicular to the incident GCIB while material growth can be substantially avoided or reduced on one or more surfaces that are substantially parallel with the incident GCIB.

As an example, the one or more surfaces that are substantially parallel with the incident GCIB may comprise an angular deviation of up to about 25 degrees from the direction of the incident GCIB. Alternatively, the one or more surfaces that are substantially parallel with the incident GCIB may comprise an angular deviation of up to about 20 degrees from the direction of the incident GCIB. Alternatively, the one or more surfaces that are substantially parallel with the incident GCIB may comprise an angular deviation of up to about 10 degrees from the direction of the incident GCIB. Alternatively yet, the one or more surfaces that are substantially parallel with the incident GCIB may comprise an angular deviation of up to about 5 degrees from the direction of the incident GCIB. Consequently, the one or more surfaces that are substantially perpendicular to the incident GCIB may comprise an angular deviation greater than about 75 degrees from the direction of the incident GCIB. Alternatively, the one or more surfaces that are substantially perpendicular to the incident GCIB may comprise an angular deviation greater than about 80 degrees from the direction of the incident GCIB. Alternatively, the one or more surfaces that are substantially perpendicular to the incident GCIB may comprise an angular deviation greater than about 85 degrees from the direction of the incident GCIB. Alternatively yet, the one or more surfaces that are substantially perpendicular to the incident GCIB may comprise an angular deviation greater than about 90 degrees from the direction of the incident GCIB. Furthermore, the deviation of the angle of incidence of the GCIB may vary plus or minus about 1 to 3 degrees due to variations in the GCIB processing equipment.

Subsequently adjusting the orientation of the substrate relative to the direction of incidence of the GCIB will then permit growth to proceed on other surfaces that are then oriented substantially perpendicular to the incident GCIB. Moreover, one or more properties of the GCIB, including the beam composition, can be adjusted or alternated in order to directionally grade the growth of multi-layer material films having differing properties from one sub-layer to an adjacent sub-layer on one or more surfaces substantially perpendicular to the incident GCIB.

Figure 14:
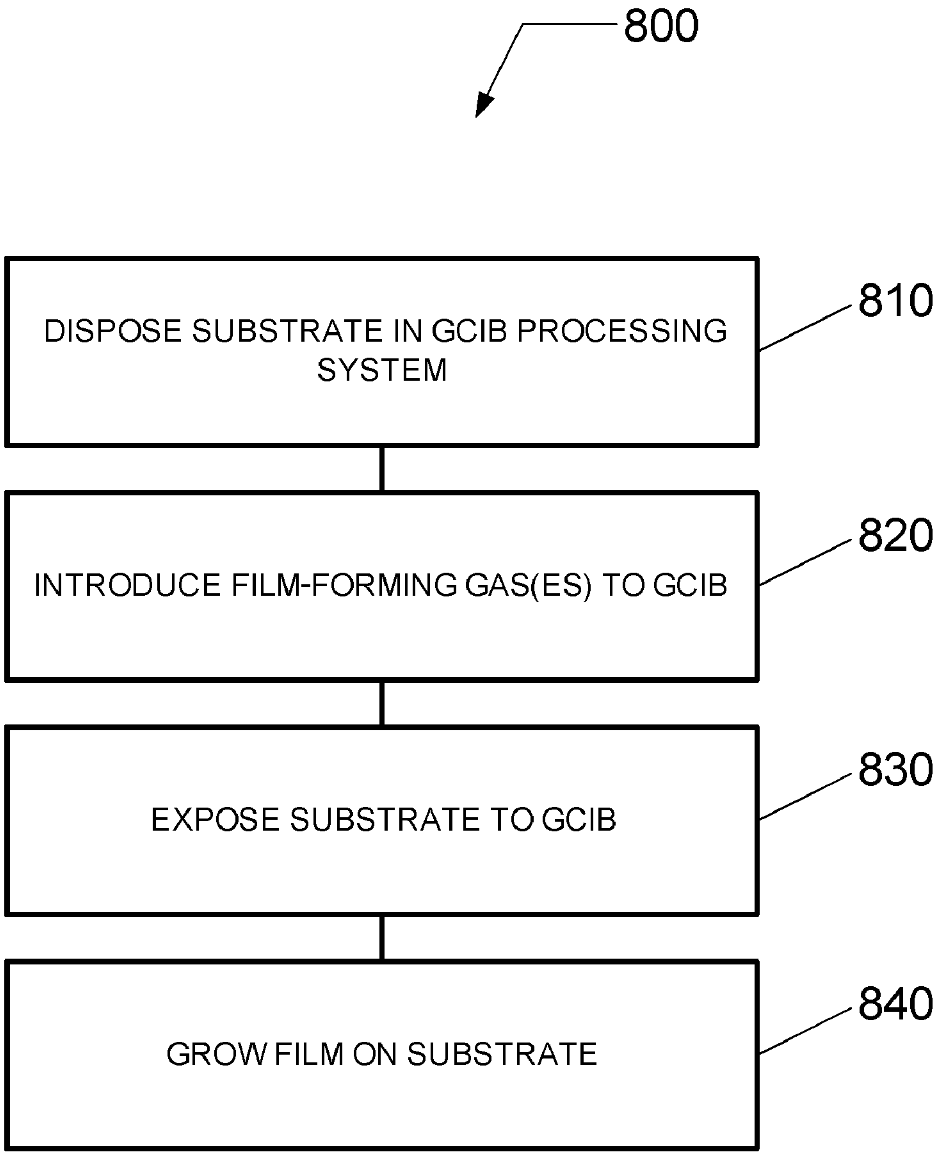
FIG. 14 is a flow chart illustrating a method for forming a thin film using a GCIB according to yet another embodiment.
Figure 15A:
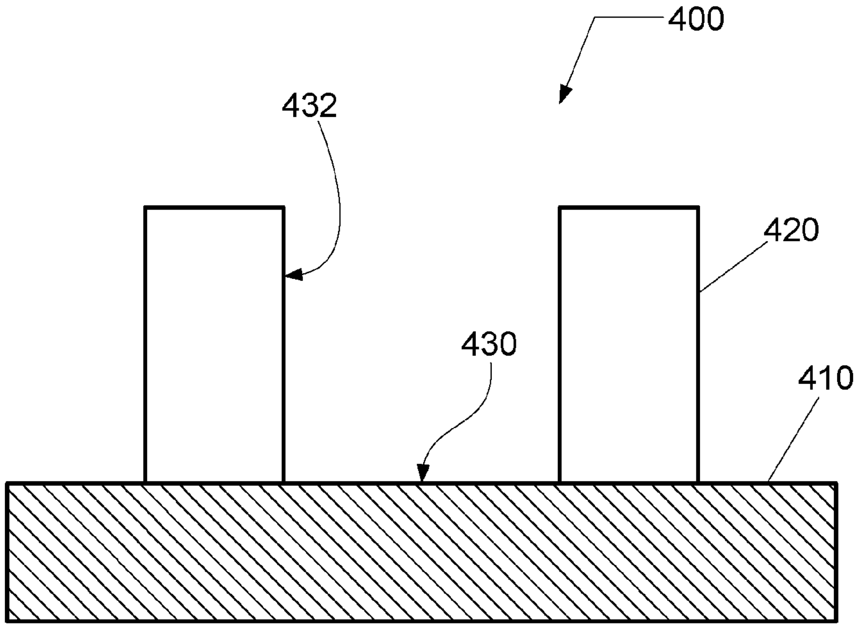
FIGS. 15A and 15B illustrate, in schematic cross-sectional view, a method of growing a thin film on a substrate according to an embodiment.
Figure 15B:
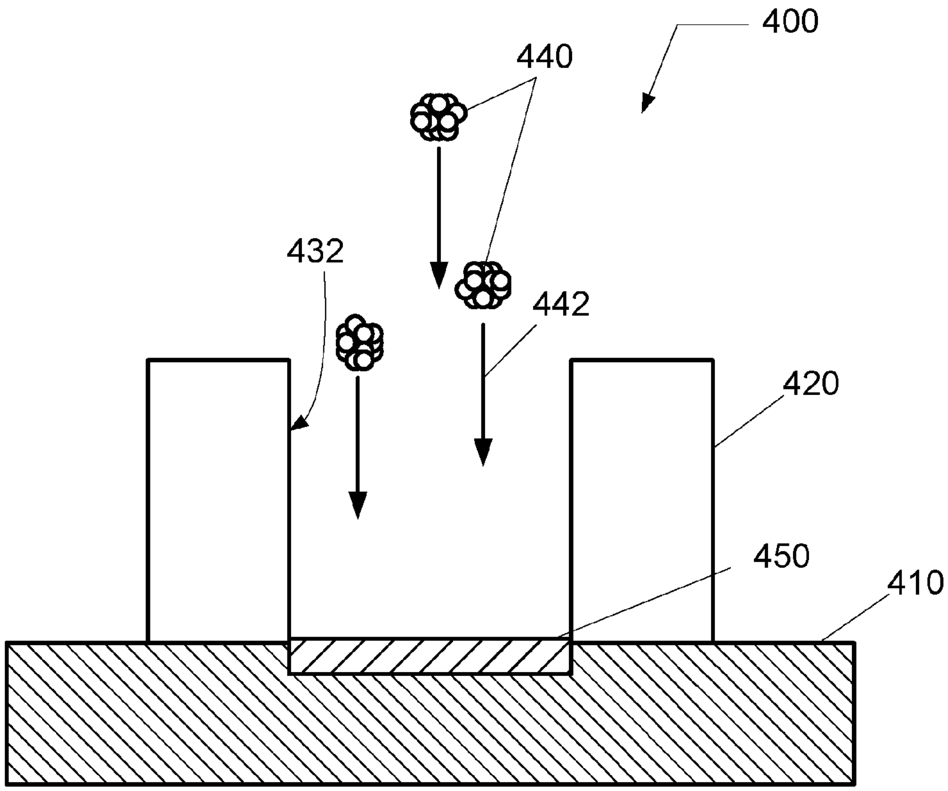

Referring to FIGS. 14, 15A and 15B, a method for growing material on a substrate having a plurality of surfaces including one or more first surfaces lying substantially parallel to a first plane and one or more second surfaces lying substantially perpendicular to the first plane using a GCIB is illustrated according to an embodiment. The method is illustrated in FIG. 14 by a flow chart 800 beginning in 810 with disposing a substrate in a GCIB processing system. The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure, while a GCIB is formed from a pressurized gas mixture comprising one or more film-forming species. The GCIB processing system can be any of the GCIB processing systems (100, 100', or 100") described above in FIGS. 1, 2 or 3, or any combination thereof. The substrate can include a conductive material, a non-conductive material, or a semi-conductive material, or a combination of two or more materials thereof. Additionally, the substrate may include one or more structures formed thereon, or the substrate may be a blanket substrate free of material structures.

For example, as shown in FIG. 15A, a material structure 400 is shown comprising one or more structures 420 formed on or in a substrate 410. One or more layers, features and/or other structures may be formed on substrate 410 prior to the formation of the one or more structures 420. The one or more structures 420 may include any structure for preparing an electronic or mechanical device or electromechanical device on substrate 410, such as an integrated circuit (IC), a micro-electromechanical (MEM) device, or a nano-electromechanical (N EM) device. Electronic devices may comprise any portion of an electronic device including, but not limited to, an interconnect structure, a transistor, or a capacitor. Mechanical devices may include, but not be limited to, a channel or conduit, a cantilever, or a column, or any combination thereof. For example, the one or more structures 420 can include a via, a contact, a trench, a capacitor trench, a gate stack, or a spacer, or any combination thereof. The one or more structures 420, formed in or on substrate 410, comprise one or more horizontal surfaces 430 that are substantially parallel with the substrate plane, and one or more vertical surfaces 432 that are substantially perpendicular with the substrate plane.

In 820, film-forming gas from a source of precursor is introduced to the GCIB and, as illustrated in FIG. 15B, a plurality of gas clusters 440 are shown collectively moving together as the GCIB in a direction 442 towards the substrate 410. As described above, a pressurized gas mixture having the source of precursor is expanded into a reduced-pressure environment to form gas clusters, the gas clusters are ionized, and the ionized gas clusters are accelerated and optionally filtered. Additionally, a beam acceleration potential may be set, and the GCIB may be accelerated accordingly. Furthermore, a beam dose may be set, and the GCIB may be irradiated accordingly.

In 830, the substrate 410 is exposed to the GCIB and, as shown in FIG. 15B, the direction 442 of incidence of the GCIB is substantially perpendicular to the substrate plane. The substrate may comprise one or more first surfaces lying substantially parallel to a first plane and one or more second surfaces lying substantially perpendicular to the first plane. During the exposing, the GCIB is directed from a source of precursor to a thin film toward the substrate with the direction of incidence as shown. The substrate is oriented relative to the direction of incidence such that the first plane is substantially perpendicular to the direction of incidence to directionally grow the thin film on the one or more first surfaces oriented substantially perpendicular to the direction of incidence, while substantially avoiding growth of the thin film on the one or more second surfaces oriented substantially parallel to the direction of incidence.

In 840, a film is formed on substrate 410 and, as shown in FIG. 15B, the impact of multiple gas clusters on the one or more horizontal surfaces 430 cause the growth of a layer 450 on the one or more horizontal surfaces 430, while causing substantially insignificant growth of a film on the one or more vertical surfaces 432. However, by adjusting the orientation of the substrate 410 (i.e., tilting the substrate) relative to the incident GCIB, film growth can be achieved on the one or more vertical surfaces 432. By orienting the substrate 410, directional growth can occur on any surface oriented to lie in a plane perpendicular to the direction of incidence of the GCIB.

As the gas clusters collide with the one or more horizontal surfaces 430, material is infused in the surface layer of substrate 410 or the underlying layer formed on substrate 410, and this material becomes interspersed with the substrate material. As the GCIB dose is increased, the thickness of the grown thin film may be increased until for a given GCIB energy (or GCIB acceleration potential) the film thickness saturates. As the GCIB energy is increased, the thickness of the grown thin film may be increased.

Amorphous films having a variety of material compositions can be produced, and anisotropic (or directional) growth can be achieved using a GCIB. Further, as the GCIB energy (or beam acceleration potential) is increased, the anisotropy (or directionality) may be increased (i.e., more material is grown on substantially horizontal surfaces while less material is grown in substantially vertical surfaces). Therefore, by adjusting the beam acceleration potential, an amount of the thin film grown on the one or more first surfaces relative to another amount of the thin film grown on the one or more second surfaces may be varied. Once the amorphous film is formed, it may be subjected to one or more thermal cycles (e.g., elevation of temperature) in order to crystallize the film.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for growing material on a substrate having a plurality of surfaces including one or more first surfaces lying substantially parallel to a first plane and one or more second surfaces lying substantially perpendicular to said first plane, the method comprising:

directing a gas cluster ion beam (GCIB) formed from a source of precursor for a thin film toward said substrate with a direction of incidence, said directing said GCIB further comprises:

generating said GCIB in a reduced-pressure environment from a pressurized gas mixture having said source of precursor at a stagnation pressure, selecting a beam size of said GCIB using a final beam aperture, selecting a beam acceleration potential, selecting a beam dose, accelerating said GCIB according to said beam acceleration potential, and irradiating said accelerated GCIB onto said substrate according to said beam dose; and orienting said substrate relative to said direction of incidence such that said first plane is substantially perpendicular to said direction of incidence and selecting and/or modifying one or more GCIB properties selected from the group consisting of said stagnation pressure, said beam size, and said beam acceleration potential to effect a directional growth of said thin film on said one or more first surfaces oriented substantially perpendicular to said direction of incidence, while substantially avoiding growth of said thin film on said one or more second surfaces oriented substantially parallel to said direction of incidence, wherein said growth of said thin film comprises constituents from said source of precursor and constituents from said substrate.

2. The method of claim 1, wherein said selecting and/or modifying includes modifying said beam acceleration potential to effect said directional growth of said thin film grown on said one or more first surfaces.

3. The method of claim 1, further comprising:

filtering said GCIB to substantially reduce the number of clusters having 100 or less atoms or molecules or both.

4. The method of claim 1, further comprising:

modifying a beam energy distribution to change a thickness of said thin film, or a surface roughness of said thin film, or both.

5. The method of claim 4, wherein said modifying said beam energy distribution comprises broadening said beam energy distribution to decrease said surface roughness of said thin film, or narrowing said beam energy distribution to increase said surface roughness of said thin film.

6. The method of claim 1, wherein said beam dose is selected to achieve a desired thickness of said thin film on said one or more first surfaces.

7. The method of claim 1, further comprising:

adjusting the orientation of said substrate relative to said direction of incidence to directionally grow said thin film on one or more of said plurality of surfaces different than said one or more first surfaces.

8. The method of claim 1, further comprising:

directing another gas cluster ion beam (GCIB) formed from another source of precursor for another thin film with said direction of incidence and selecting and/or modifying said one or more GCIB properties to effect a directional growth of said another thin film on said one or more first surfaces of said substrate, wherein the material composition of said another thin film is different than the material composition of said thin film.

9. The method of claim 1, wherein said pressurized gas mixture comprises $O_2$, $N_2$, NO, $NO_2$, $N_2O$, CO, or $CO_2$, or any combination of two or more thereof.

10. The method of claim 1, further comprising:

annealing said thin film.

11. The method of claim 1, wherein said directional growth of said thin film is effected on said one or more first surfaces within a trench or a via formed on said substrate.

12. The method of claim 1, wherein said directional growth of said thin film is effected on one of said one or more first surfaces that abuts a film stack.

13. The method of claim 1, wherein said directional growth of said thin film is effected on said one or more first surfaces by oxidizing at least one of said one or more first surfaces.

14. The method of claim 1, wherein said directional growth of said thin film is effected on said one or more first surfaces by nitriding at least one of said one or more first surfaces.

15. The method of claim 1, wherein said directional growth of said thin film is effected on said one or more first surfaces by forming an oxynitride of at least one of said one or more first surfaces.

16. The method of claim 15, wherein said source of precursor for said thin film comprises $O_2$, $N_2$, NO, $NO_2$, or $N_2O$, or any combination of two or more thereof.

17. The method of claim 1, wherein said directional growth of said thin film is effected on said one or more first surfaces by forming a germanide of at least one of said one or more first surfaces.

18. The method of claim 1, wherein said substrate upon which said thin film is directionally grown is an electronic device selected from the group consisting of an interconnect structure, a transistor, or a capacitor.

19. The method of claim 1, wherein said substrate upon which said thin film is directionally grown is a micro-electromechanical device or a nano-electromechanical device.

* * * * *